United States Patent [19]

Geisler et al.

[11] Patent Number: 5,399,254
[45] Date of Patent: Mar. 21, 1995

[54] APPARATUS FOR PLASMA TREATMENT

[75] Inventors: Michael Geisler, Wächtersbach; Michael Jung, Kahl/Main, both of Germany

[73] Assignee: Leybold AG, Hanau, Germany

[21] Appl. No.: 659,817

[22] Filed: Feb. 22, 1991

[30] Foreign Application Priority Data

Dec. 14, 1990 [DE] Germany ............ 40 39 930.3

[51] Int. Cl.⁶ .................. C23C 14/00; C23C 16/00
[52] U.S. Cl. .................. 204/298.31; 156/345; 118/723 R; 118/718
[58] Field of Search ............. 204/298.31; 118/718, 118/723 R, 729; 156/345

[56] References Cited

U.S. PATENT DOCUMENTS 4,767,641 8/1988 Kieser et al. ............ 204/298.31

Primary Examiner—Nam Nguyen
Attorney, Agent, or Firm—Felfe & Lynch

[57] ABSTRACT

The invention concerns an apparatus for the plasma treatment of substrates in a plasma discharge excited by a high frequency between two electrodes 3, 8 to which power is supplied by a high frequency source, where the first electrode is configured as a hollow electrode 3 and the second one as an electrode 8 holding a substrate 7 and situated upstream of the hollow chamber 10 of the first electrode which it also passes. The hollow electrode is enclosed by a dark space shield and has an edge pointing in direction of the second electrode and also has projection located between the edge. These projections are on the same potential as the second electrode. The radio frequency power is thus decoupled from the substrate bias voltage (selfbias) and the distance between the first and the second electrode can be changed.

9 Claims, 6 Drawing Sheets

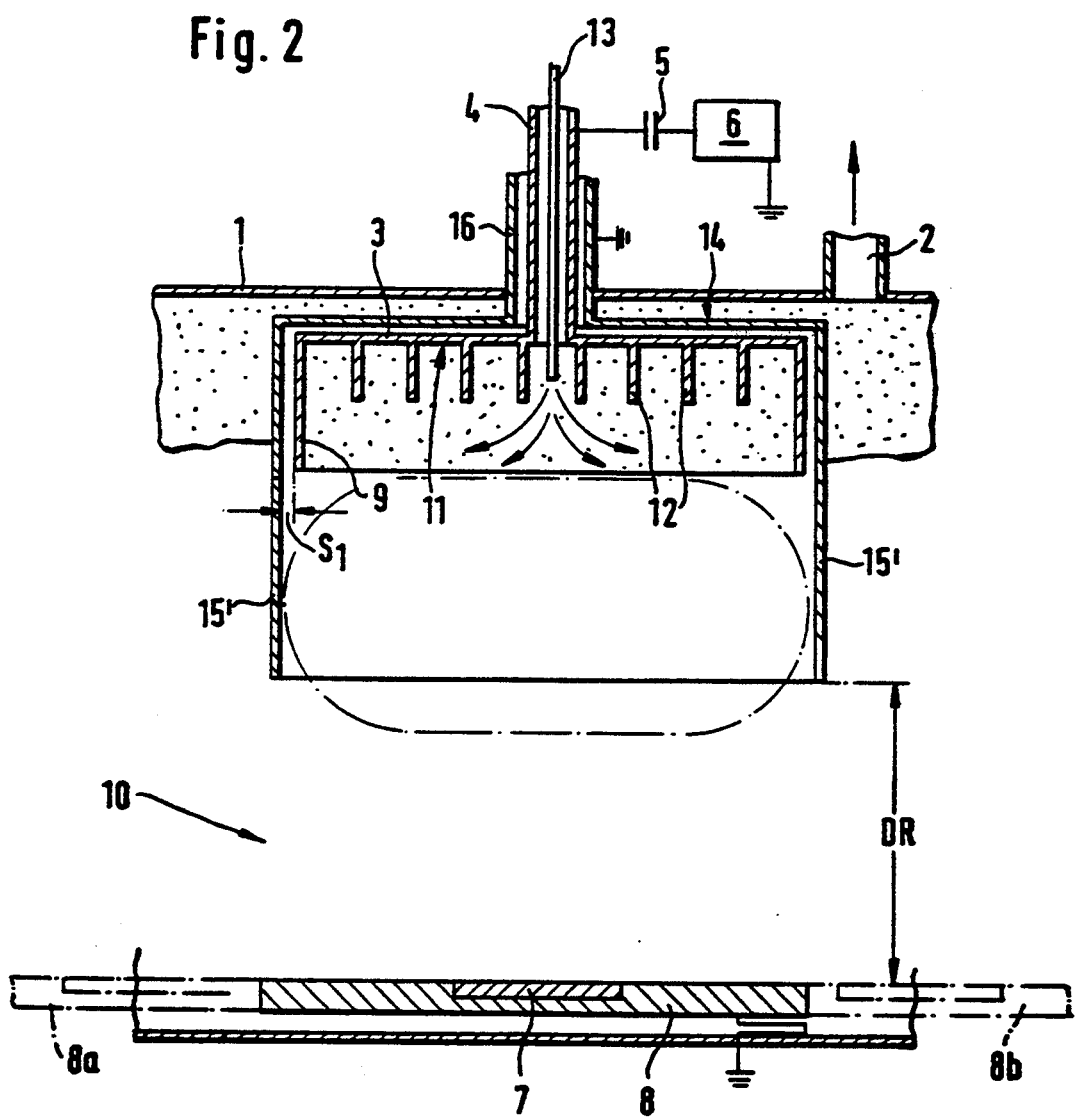

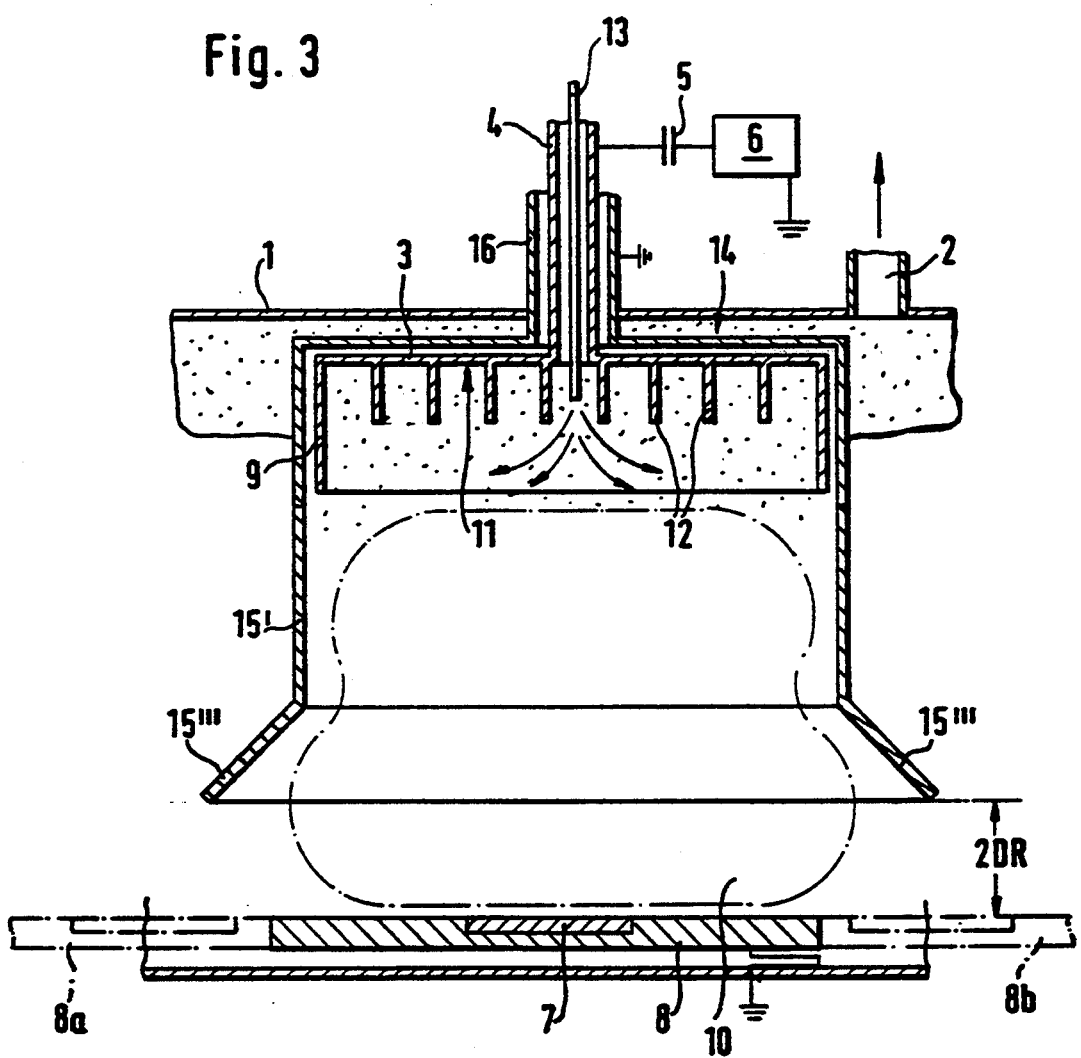

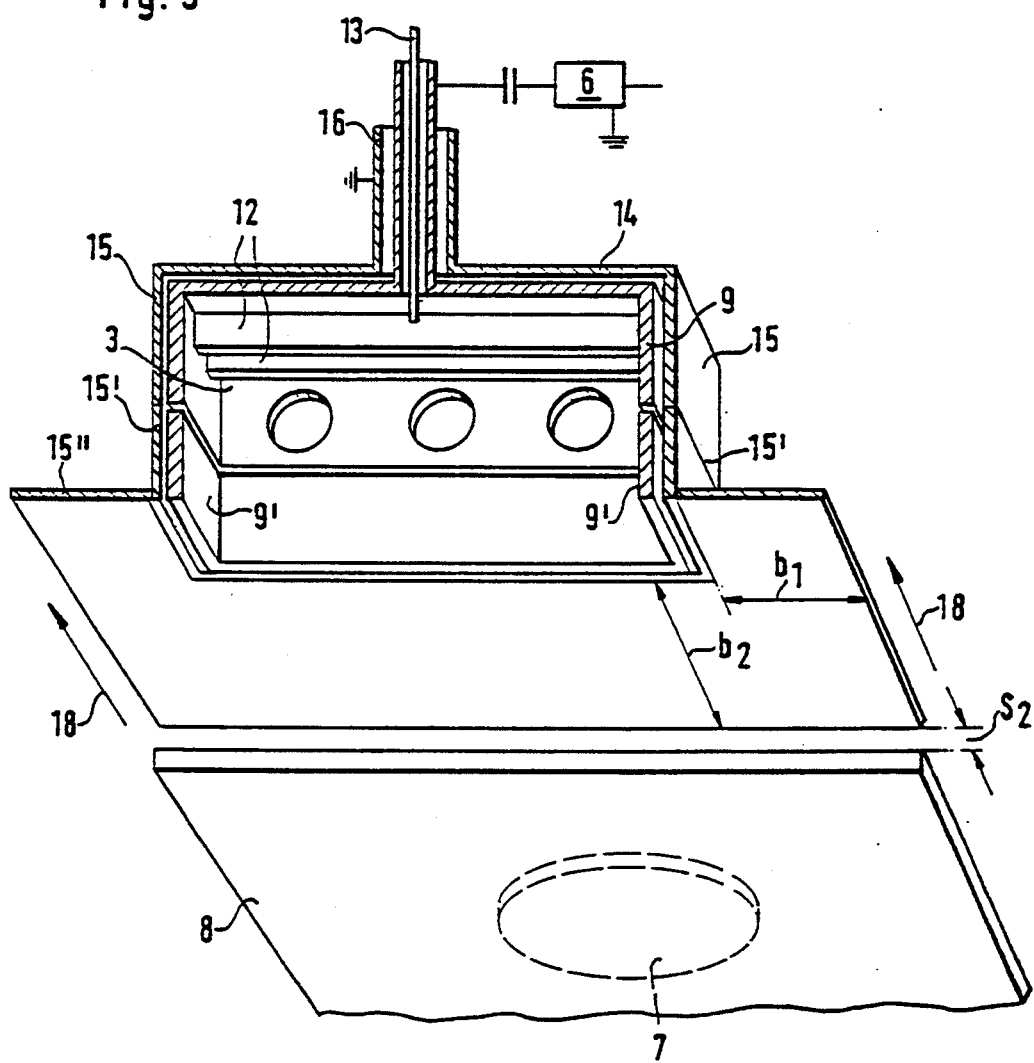

APPARATUS FOR PLASMA TREATMENT

BACKGROUND OF THE INVENTION

Apparatus for the plasma treatment of substrates in a plasma discharge which is excited by high frequency and occurs between two electrodes to which power is supplied by a high frequency source. The first electrode is configured as a hollow electrode, and the second one is an electrode which carries a substrate and is disposed upstream of the hollow chamber of the first electrode which it also passes. The hollow electrode is surrounded by a dark space shield and has an edge pointing in direction toward the second electrode and also has projections between the edge which are on the same potential as the second electrode.

An apparatus for the plasma treatment of substrates by means of high frequencies usually has two electrodes one of which is formed by the vacuum chamber and/or the substrate holder which are both made of a metallic material. It is known that a plasma of a predominantly negative voltage develops at the one electrode which, with respect to those surfaces that act as counter electrodes, have the smaller active surface. The negatively biased electrode is hence usually referred to as "cathode."

When, on the one hand, a plate-like substrate holder is used which has the potential as the vacuum chamber thus forming the electrode and, on the other hand, when a plate-like electrode is used which is opposite the substrate holder, the negative potential will form due to the necessarily given surface proportions on the latter electrode. Material (=target) located on this electrode (=cathode) is thus sputtered and deposited on the substrate. If the substrates are to be etched in such an apparatus, substrates and target must be exchanged correspondingly.

When a direct voltage is used, then the polarity of the electrodes is definitely prescribed by its connection to the respective pole of the direct current source. From DE OS 21 15 590, for example, it is known to use a hollow cathode which has an edge protruding in direction toward the substrate carrier in order to improve the uniformity of the layer thickness distribution. However, when direct current is used, this protruding edge does not bring about a reversal of the polarity.

DE 22 41 229 discloses an apparatus where a high frequency is used to accomplish the following; due to its edge, the hollow electrode relative to the surface of other electrode (of the substrate holder) which directly faces the hollow chamber, has the larger surface. It thus assumes the function of an anode so that there is reversal of the relations, so to speak, with respect to the bias voltage. This can also be explained in less complicated terms as follows: when there is a sufficiently small space between this other electrode and the edge of the hollow electrode (gap S), the edge of the hollow electrode defines a discharge chamber relative to which those metallic parts of the apparatus, which are on the outside, no longer execute any electrode functions. The proportions are exclusively determined, on the one hand, by those surface parts of the hollow electrode which face one another and, on the other hand, by the substrate holder. This is referred to as the "edge effect."

However, when this known principle of the solution is applied in an apparatus with a continuous substrate transport, some problems will occur: When the substrate holder with the substrate is moved away, at least the metallic base plate of the vacuum chamber will act as a counter electrode. It usually has a larger surface than the hollow electrode and is connected to ground. In this case, a negative voltage, in complete reversal of the potentials, will be generated on the hollow electrode, now acting as a cathode.

This shows that the size of the gap between the edge of the hollow electrode, on the one hand, and the substrate or substrate holder, on the other hand are of essential importance to the distribution of the potential in the area of the chamber filled by plasma. Since this gap constitutes the connection of the plasma to its surroundings, the size of the gap will decide whether the hollow electrode will act as an anode or a cathode of the arrangement. Experiments have shown that when the gap is enlarged by an amount of more than 2 mm, the effect increases with the consequence that a negative bias voltage is generated on the hollow electrode instead on the substrate. Such enlarged gaps, however, are practically unavoidable in continuous apparatus where the substrates are disposed on movable substrate holders. This applies especially when such substrate holders, while spaced apart, pass the opening of the hollow electrode. The, the width of this gap cannot be freely selected since this would require an extremely precise control of the substrate holders. The substrates, which can be on the surface of the holder, modify the gap width while they traverse the apparatus unless expensive provisions are made to use a different substrate holder for each substrate form and size into which the substrates are then lowered so as to be even with the surface of the substrate holder. This greatly reduces the range of application of the known principle.

Further, an apparatus of the aforesaid kind is known (DE OS 36 06 959 A1) for the plasma treatment of substrates in a plasma discharge excited by high frequency and located between two electrodes to which power is also supplied by a high frequency source. The first electrode is configured as a hollow electrode, and the second one which carries a substrate is situated opposite of the first electrode and passes it. In this known arrangement, the hollow electrode is surrounded by a dark space shield and by an edge pointing in direction of the second electrode. Further, within the edge there are projections which are approximately on the same potential as the first electrode. Since this known arrangement does not allow a decoupling between radio frequency power and direct voltage power of substrate and plasma (selfbias=substrate bias voltage), the selfbias can only be influenced by modifying the radio frequency. Also, when the power of the radio frequency is reduced, the deposition rate also decreases which often impairs the quality of the substrate.

SUMMARY OF THE INVENTION

In addition to optimum gas supply and removal and maintaining an approximately constant radio frequency power, the invention, selectively adjusts certain properties of the layer which grow on the substrate and are determined by the selfbias.

The selfbias or substrate bias voltage is the direct voltage portion of the high frequency modulated voltage between the positive column of the glow discharge and the substrate surface. Here the frequency is 13.06 $MH_z$, but frequencies from 0.5 to 100 $MH_z$ are possible.

For this, it is advantageous that the radio frequency power is decoupled from the substrate bias voltage (selfbias). The growing of the layer is thus drastically improved. This is a particular advantage when aSi-layers (layers of amorphous silicon) are deposited. The decoupling of the radio frequency power and the selfbias between plasma and substrate permits exactly adjusting certain properties of the layer in a simple manner. It is, for example, possible to select a hydrogen content between 8% and 40% and a layer density between 1.7 and 0.8 g/cm$^3$. It also turns out that, given independent bias voltage and radio frequency power, the permeating properties of gases across an aC:H-layer can be adjusted selectively and largely independent of the deposition rate to be obtained for the respective case. Also, the process of the invention is very economical. Further, it is possible to adjust a diffuse-adhesive link between an aC:H upper layer (topcoat) and another layer therebelow.

Further, the plasma should be independent of the substrate position and other possibly movable, changeable components, e.g.: avoiding a dragging of the plasma across the substrate holder which passes the stationary electrode in order to be able to carry out a uniform, reproducible coating process.

A particular feature of the invention proposes that the surface area of the first and the second electrodes can be changed by inserts with the purpose of changing the ratio of the surface area of the first electrode with respect to the second electrode by means of these inserts. The possibility of varying the substrate bias voltage (selfbias) at a constant radio frequency power improves the manufacture of amorphous silicon layers or membrane layers. Further, the arrangement of the invention also offers the possibility of using the plasma source in systems for coating large surfaces.

The surface area of the first electrode is referenced as $F_1$ and the surface area of the second electrode is referenced as $F_2$.

If the negative substrate bias voltage relative to the potential of the hollow electrode is to be at a maximum, then $F_1/F_2$ must also be at a maximum. The inserts extending the hollow electrode are therefore on the same potential as the hollow electrodes. It is important that the distance between the hollow electrode and the inserts facing it is smaller than or equal to 1 mm. The distance $S_2$ between the dark space shield and the second electrode has a preferred width of 1 to 2 mm with no line of sight contact between the insert extending the dark space shield and the plasma volume. If the distance $S_2 \leq 2$ mm, then the obtained. If a substrate bias voltage $U_B > -U_{max}$ is desired, then the inserts extending the hollow electrode 9' must be put on the potential of the second electrode, hence in most cases ground potential.

As long as $F_1/F_2 > 1$ is fulfilled, the substrate bias voltage $U_B \leq -10$ V remains, i.e. the arrangement is directed such that the processes on the substrate surface are supported by fast ions (amplified ion-supported process).

The inserts can be easily mounted by means of plug connections or easily accessible screws at the hollow electrode or the ground shield. To clean the reactor, the inserts can be removed as easily as the hollow electrode. Moreover, this allows limiting the contamination of the cold, grounded electrodes and the recipient to a minimum area which in turn results in a high service life of arrangement and apparatus as well as freedom from pinholes in the layers applied.

If the inserts are connected to ground, hence are part of the second electrode, and if $F_1/F_2$ is smaller than 1, then the substrate bias voltage $U_B \geq -10$ V. In the case, the processes on the substrate surface are to occur without amplified ion support, the distance $S_2$ can be significantly larger than 2 mm. A distance $S_2$ of, approximately 30 mm has the advantage of a relatively free gas supply and removal. Moreover, it is possible to apply discharge pressures of $>10$ Pa with a relatively low degree of excitation or fragmentation of the gas molecules. Further, it is possible to coat and treat complicated, three-dimensional substrate surfaces.

Finally, it was found that due to the very small distance between the first electrode and the second electrode, it is possible to obtain a very good localization of the plasma. This can be of decisive importance when too narrow a plasma contact of the substrate surface is to be avoided. The arrangement of the insert surfaces with respect to each other is another reason for this good plasma localization. The inserts face one another and together with the hollow electrode, they enclose a prismatically formed chamber open toward the substrate side.

In another embodiment of the invention, provision is made for inserts with projections which approximately correspond to the relatively short, parallel running projections of the hollow electrode. Further, it is advantageous for the surfaces following the edge of the dark space shield and hence the inserts, extending the dark space shield, to be funnel-like expanded toward the substrate.

When working with this apparatus, it is possible to produce elongated, uniform glow discharges even with higher discharge pressures of $>10$ Pa. The apparatus can thus be used for the coating of large surfaces.

The version of the apparatus (with a distance $S_2 < <DR$) has proven very successful in the surface oxidation of shaped articles made of polypropylene with a length of 2 m. Especially the good gas supply and removal, the low degree of oxygen excitation, suitability of the apparatus for the shaped articles as well as good localization and large-area flow discharges were decisive factors in this success.

This further offers the possibility of limiting the contamination of the "cold," grounded electrodes and the recipient to a smallest possible area. This in turn results in a long service life of the arrangement or apparatus and in largely void-free layers. Further, the arrangement of the invention reduces the filter formation of "hot," non-grounded electrode. Further, in this process, the initial monomers are hardly fragmented in the plasma.

It is essential that the projections are shorter than the edge of the hollow electrode, these projections, the edge and the inserts being on the same potential.

The edge of the hollow electrodes together with the insert ending the hollow electrode have approximately the same length as the outer edge of the dark space shield.

In the present invention, it is of particular importance that the distance of the outer surface of the first electrode is approximately 1 to 3 millimeters in width.

In another embodiment of the invention, it is advantageous that the auxiliary electrode is spaced apart from the surface of the first electrode at a distance which approximately corresponds to the distance of the dark space (DR). Further, it is advantageous that the outer end of the edge of the hollow electrode is spaced apart from the outer end of the edge of the dark space shield.

In connection with the arrangement of the electrode, it is advantageous that, the distance between the insert extending the dark space shield and the surface of the second electrode can be varied. It is the change of this distance, in particular, that allows a ready modification the layer properties or an adjustment of the layer to a certain thickness or quality.

Another improvement of the invention is to make provisions for openings for the gas to pass in the walls of the hollow electrode and the dark space shield. In these openings, there are plasma-impermeable covers which form labyrinth-like canals.

To ensure best-possible gas supply and removal, provision is made for openings of varying diameters in the walls of the hollow electrode and the dark space shield. For this purpose, it is also possible that the inside front edges of the openings form a labyrinth-like canal together with the outside front edges of the cover.

Further, it is advantageous that the projections in the first electrode can be replaced and that their height can be adjusted.

BRIEF DESCRIPTION OF THE DRAWINGS

FIGS. 1 to 3 are vertical axial sections across a complete apparatus for treating plate-like substrates, FIG. 5 is a perspective representation of a hollow electrode with a coupling element, the section taken along a symmetric plane of the hollow electrode.

DETAILED DESCRIPTION OF THE PREFERRED EMBODIMENT

Figure 1:
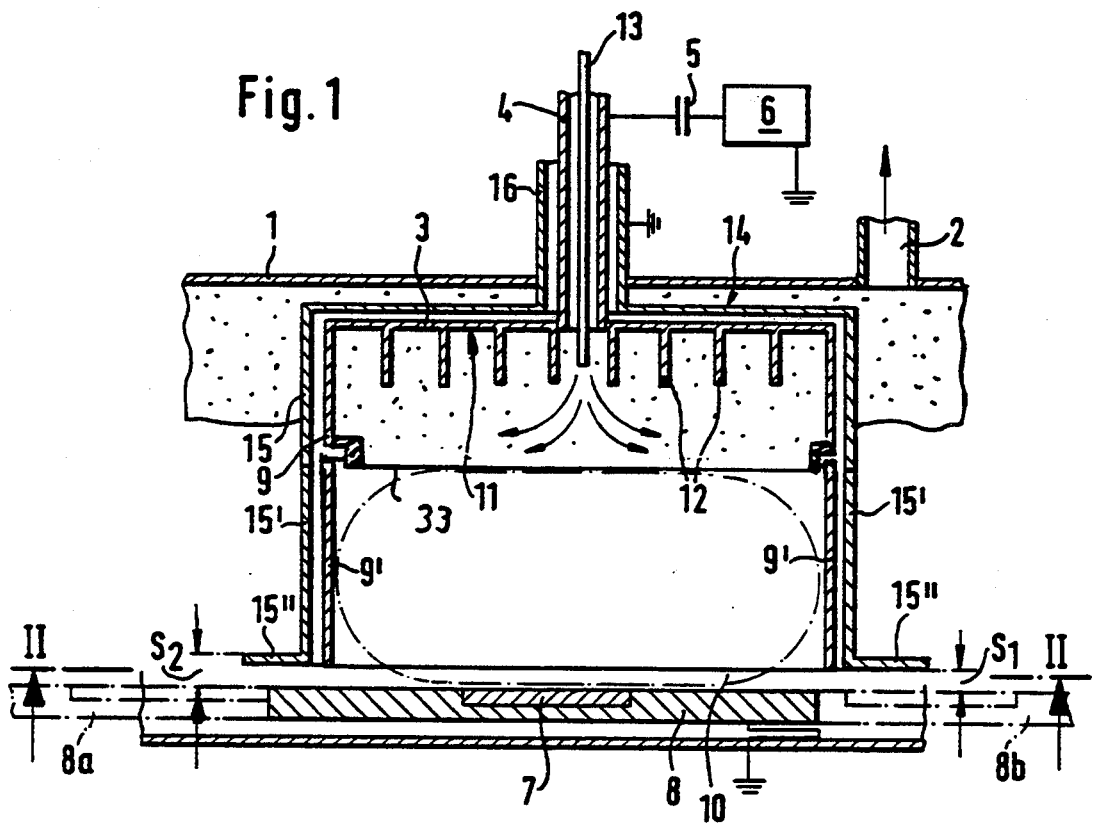
Figure 4:
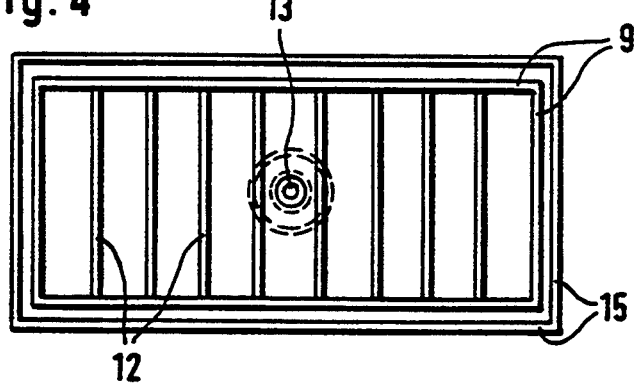
FIG. 4 is a bottom view of the hollow electrode in the plane II—II in FIG. 1.

FIG. 1 shows a vacuum chamber 1 which can be evacuated to a pressure usually required for such plasma processes by means of a suction piece 2. A hollow electrode (electrode 3) is inserted into the top of the vacuum chamber 1. An electrically conductive carrier 4 and a capacitor 5 and a not represented adjusting network connect this electrode to the high frequency power source 6. Below electrode 3, there is a second electrode 8 which holds a substrate 7 thus acting as a substrate holder. On its entire rectangular circumference, this hollow electrode 3 has an edge 9 which protrudes in direction toward the electrode 8 and is on the same potential as the hollow electrode 3. With respect to the second electrode 8, this edge forms an all-around gap "$S_1$". The edge 9 can be supplemented by an insert 9', which may or may not be electrically connected to the electrode 3. When connected, it forms a gap $S_1$ of approximately 2 mm as shown.

The areas of the metal surfaces which act as a counter electrode (electrode 8) to electrode 3 can be changed by incorporating parts or inserts. They are on the same potential as electrode 8. They are secured via non-represented fastening means and are on ground potential.

The potential generated between the plasma and electrode 8, and the electrode 8 in position 8a, determines the energy that accelerates positive ions toward the substrates 7. Layer growth is hence significantly influenced by the energy at which the ions collide with the target. Due to the advantageous incorporation of inserts, the ion energy can be changed independent of other parameters. To date, the electron energy could only be significantly influenced by changing the radio frequency. To reduce the ion energy, while maintaining the same discharge pressure, the radio frequency power was reduced. This also reduced the rate of deposition and productivity and consequently often also the quality of the coating.

Further, it is advantageous to also extend the edge 15 of the dark space shield 14 by insert 15' and a skirt 15". This ensures that the plasma will not encounter an undesired counter electrode (cf. FIG. 1), and it is a simple way of having the plasma burn only at places where this is desired. The lower front border of edge 9 (according to FIG. 1) can be provided with a small projection 33 which laps over the insert 9' so that no line of sight contact will occur between insert 15' and plasma volume.

The hollow electrode 3 consequently comprises a hollow chamber 10 where the inner surface 11 is enlarged by projections 12 formed by parallel ribs (also cf. FIG. 2). As regards the space between these projections, it must be substantially larger than the distance of the dark space in the applied vacuum. In vacuum of approximately $2 \times 10^{-2}$ mbar, this leads to a practically useful distance between the individual projections and the distance from edge 9 of approximately 20 mm. The height of the ribs is not limited, however, in the interest of a good homogeneity of the gas composition in the area of substrates 7, it should not exceed approximately half of the height of edge 9. In FIG. 1, these proportions are represented approximately true to dimensions.

The lower circumferential, rectangular border of edge 9 together with insert 9', which also defines the gap with width "$S_1$", constitutes the opening of the hollow electrode 3.

With the exception of the lower opening, the hollow electrode 3 is completely surrounded by the block-like dark space shield 14. The edge 15 thereof, supplemented by edges 15', 15", form a gap $S_2$ with a width of approximately 1 mm with respect to the second electrode 8. Non-reacted products of the gases supplied are fed by gas feed pipes and removed via gaps $S_1$ and $S_2$.

Another carrier 16 connects the dark space shield 14 to the vacuum chamber in an electrically conductive manner and hence is on ground potential together with vacuum chamber 1.

Each of the left and right end of vacuum chamber 1 is connected to a non-represented vacuum lock through which the electrodes 8, which serve as substrate holders, are sequentially introduced into the apparatus and also withdrawn again. Electrode 8 is represented in broken lines in two other positions 8a, 8b which it occupies during its travel.

FIGS. 2 and 3 show two other variants of electrodes 3. The inserts 9' are removed and electrode 3 is at a substantially larger distance to electrode 8 than electrode 8 according to FIG. 1. The distance is selected such that it is significantly larger than the mean free length of travel of the electrons and ions. This ensures that plasma burns predominantly between the surfaces of inserts 15' extending the dark space shield.

In the embodiment of FIG. 3, the coupling elements 15''' are bent toward the outside while they are spaced apart from substrate 7 at approximately the same distance as the inserts 15'. The arrangement of FIG. 3 was used to deposit an amorphous carbon (aC) layer of approximately 400 Å in thickness on a substrate of 400 mm in width which continuously passes the source. In the test, the arrangement has a length of 400 mm (transverse to the direction of moving) with the hollow electrode 3 having a width of 100 mm (in direction of moving). The thickness of the layer was measured ellipsometrically. The resulting measurement shows that the layer thickness was uniform over a length of 360 mm along the direction of moving of the substrate. This corresponds to 90% of the length of the electrode and makes the process particularly suitable for the coating of large surfaces.

An advantage of the arrangement is the temperature insensitivity of the presented apparatus, especially during the production of $Si_2N_3$ and amorphous silicon layers. The process of the invention is thus advantageously distinguished from a radio frequency magnetron which is equipped with expensive, temperature sensitive permanent magnets and water-cooled devices which are principally susceptible to defects.

In several of the PECVD processes which are also suitable for the coating of large surfaces, attempts have been made to obtain a lower degree of monomer fragmentation and excitation in the glow discharge. Examples include the manufacture of membranes and the surface modification on plastics. A radio frequency magnetron suggests itself here since it is known for its good scaling properties (analogous to a sputtering magnetron) and for similar reasons also an ECR PECVD plasma source. Due to the enclosure of the plasma in a magnetic field, however, there is a high degree of monomer fragmentation involved with these devices which is not desired for the purpose described. It is for this reason that rf-magnetrons and ECR PECVD sources are employed. The rf-hollow electrode arrangement, however, does not require the support of a magnetic field and therefore exhibits a particularly small degree of monomer fragmentation and excitation.

FIG. 5 shows a hollow electrode with a section taken along its plane of symmetry. It has projections 12 and a dark space shield 14 which are completely analogous to FIG. 1. On the circumference of the dark space shield 14 which is also shown in a section taken along is plane of symmetry, there is a known electrical coupling element 15". The latter is configured in the form of a rectangular, planar frame made of metal and connected to the dark space shield insert 15' in an electrically conductive manner. The width $b_1$ and $b_2$ of the frame ranges between 4 and 12 cm. The arrangement is made such that the coupling element 15" is exactly even with the open bottom or edge of the inserts 15' of the dark space shield 14. The electrode 8 holding the substrate 7 passes the opening of the hollow electrode 3 at the distance of gap $S_2$ and parallel to the coupling element 15" in direction of the two arrows 18. In order to achieve a functioning electrical coupling of the electrode, it suffices when this electrode covers three circumferential sides of the coupling element 15".

Figure 6A:
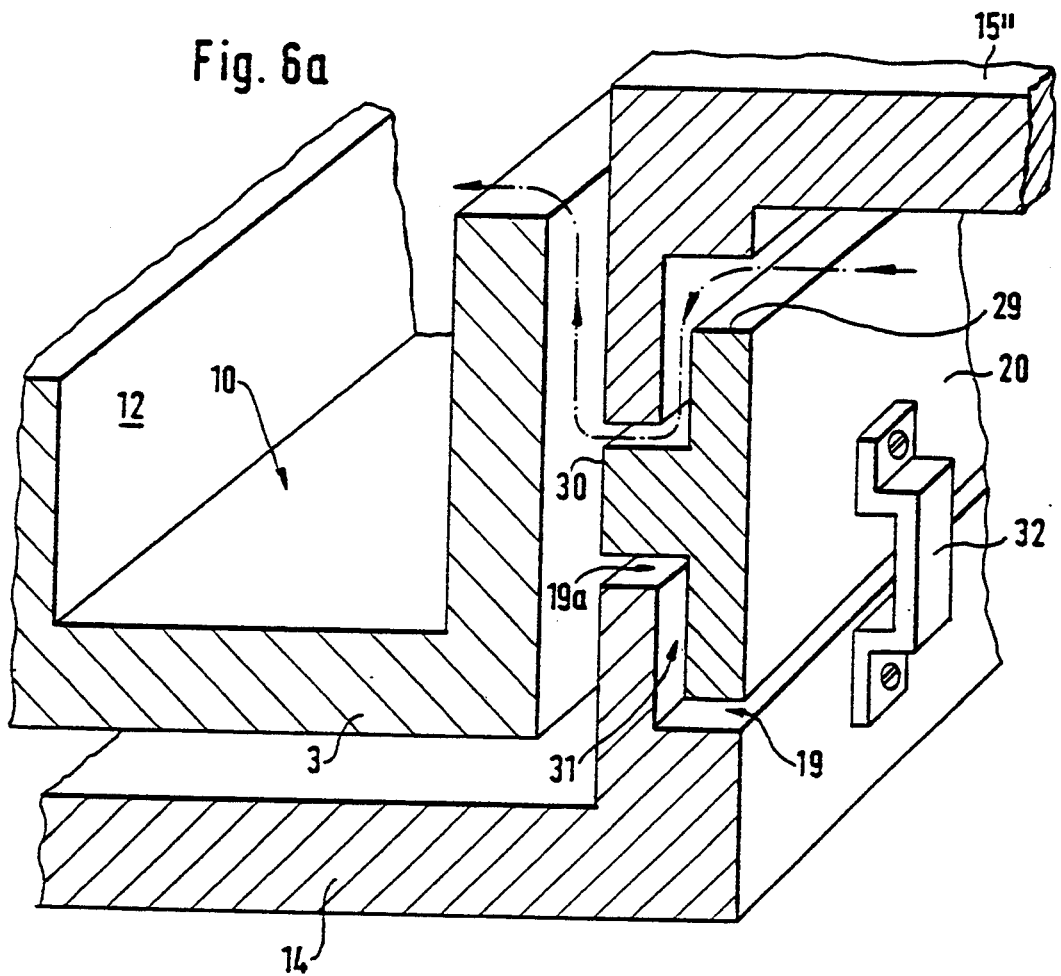
FIG. 6a is an enlarged perspective view of a detail of FIG. 5.

FIG. 6a is an enlarged, true to scale view of segments of the walls, namely the edges of the hollow electrode 3 and the dark space shield 14. The two aligned openings 19 and 19a are provided with a metal cover 20 impermeable to plasma. Correspondingly matching the shape of the hollow electrode 3, this cover 20 is of prismatic form. The cover can be composed of two segments of different width. The inside front edges 30 of the openings 19, 19a together with the outside front edges 29 of the covers 20 form a labyrinth-like canal 31. A fastener 32 indirectly secures the cover 20 relative to the electrode 3.

The plasma is thus enclosed in the hollow chamber 19 as if there were a rigid wall. The gas transport, however, is interfered with as little as possible.

Figure 6B:
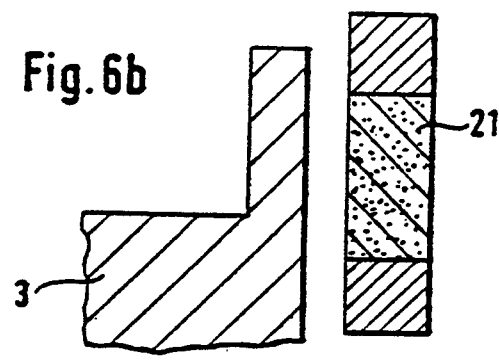
FIG. 6b is a partial section of an embodiment of a cover.

For the preferred frequency of 13.56 MHz according to FIG. 6b, the internal width between the canals 31 has to range between a few tenth of a millimeter up to approximately one millimeter. The distance of a shield 21 from the surface of the hollow electrode associated with it, amounts to approximately 5 mm. The shield can be made of a porous sintered metal.

Figure 7:
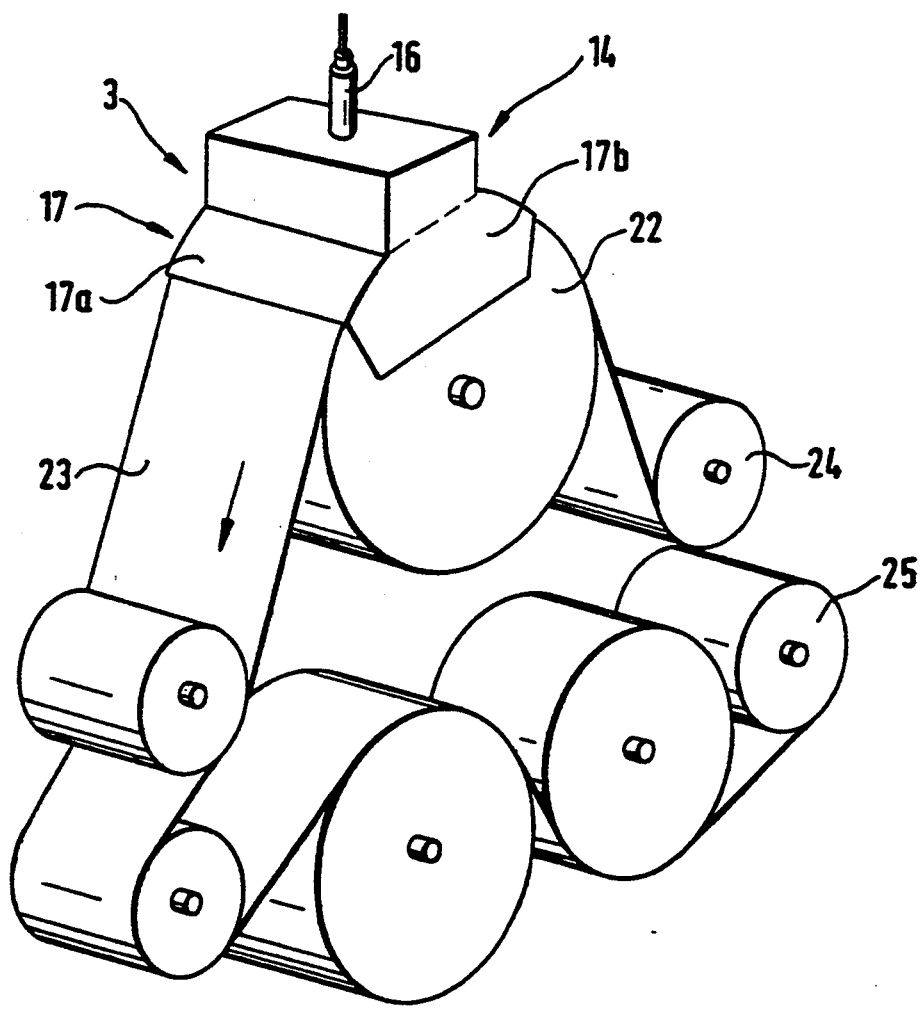
FIG. 7 is an arrangement analogous to FIG. 5, it has, however, a drum-shaped substrate holder for the plasma treatment of flexible, band-type substrates.

FIG. 7 is a variant of the subject matter of FIG. 5 where the electrode 22 is a metallic cooling drum over which a band-type substrates runs which originates at a supply roll 24 and is collected on a take-up roll 25. The remaining rollers in between are either guide or cooling rollers for further treatment which are of no particular interest to this purpose. Only the dark space shield 14 of the hollow electrode is shown here. This shield as well as the non-represented hollow electrode match the cylindrical contour of electrode 22. In order to keep the axial expansion of this arrangement at a minimum, the electrical coupling element 17 is composed of several parts. In the area of the cylindrical surface of electrode 22, the coupling element 17 has on each side a cylindrical part 17a of which only the front one is visible in FIG. 7. In the area of the circular front surface of the second electrode 22, the coupling element 17 is composed of two flat parts 17b of which also only the front one is visible. All of these parts 17a and 17b, however, meet the requirement of running essentially parallel to the adjacent surface of the electrode 22 at the distance of gap $S_2$.

As used herein, PCVD refers to physical chemical vapor deposition. PVD or physical vapor deposition includes sputtering layers produced by the so-called reactive process, where the chemical reaction occurs on the substrate.

We claim:

1. Apparatus for the plasma treatment of substrates comprising a first electrode configured as a hollow electrode comprising a surrounding edge and a plurality of projections therein at like potential extending parallel to said edge, a high frequency RF power source connected to said first electrode, a second electrode configured as a substrate carrier situated opposite said first electrode and facing said projections therein, a dark space shield surrounding said first electrode and having a surrounding edge about said surrounding edge of said first electrode, and a removable insert extending said surrounding edge of said dark space shield beyond said surrounding edge of said first electrode toward said second electrode, said removable insert being at common potential with said dark space shield.

2. Apparatus as in claim 1 further comprising a removable insert extending said surrounding edge of said first electrode toward said second electrode.

3. Apparatus as in claim 2 wherein said removable insert of said first electrode is at common potential with said first electrode.

4. Apparatus as in claim 2 wherein said removable insert of said first electrode is at common potential with said second electrode.

5. Apparatus as in claim 2 wherein said removable insert of said first electrode is separated from said surrounding edge of said first electrode by a gap, said apparatus further comprising means preventing line of sight contact between said dark space shield and a plasma volume within said insert extending said first electrode.

6. Apparatus as in claim 2 wherein said removable insert of said dark space shield and said removable insert of said first electrode extend to a like distance from said second electrode.

7. Apparatus as in claim 1 wherein said substrate carrier is substantially planar, said apparatus further comprising a planar skirt about said removable insert of said dark space shield and parallel to said substrate carrier, said skirt being at common potential with said dark space shield.

8. Apparatus as in claim 1 further comprising gas passage means in said surrounding edge of said first electrode and said surrounding edge of said dark space shield.

9. Apparatus as in claim 8 wherein said gas passage means preventing line of sight contact between any area outside of said dark space shield and a plasma volume with said first electrode.

* * * * *